United States Patent
Bailey et al.

(10) Patent No.: US 7,091,783 B2
(45) Date of Patent: Aug. 15, 2006

(54) REJECTION CIRCUITRY FOR VARIABLE-GAIN AMPLIFIERS AND CONTINUOUS-TIME FILTERS

(75) Inventors: James A. Bailey, Snowflake, AZ (US); Ted V. Burmas, Fremont, CA (US); Stephen J. Franck, Felton, CA (US)

(73) Assignee: Agere Systems Inc., Allentown, PA (US)

( * ) Notice: Subject to any disclaimer, the term of this patent is extended or adjusted under 35 U.S.C. 154(b) by 56 days.

(21) Appl. No.: 10/757,242

(22) Filed: Jan. 14, 2004

(65) Prior Publication Data

US 2005/0151588 A1    Jul. 14, 2005

(51) Int. Cl.
*H03F 3/45*    (2006.01)
(52) U.S. Cl. ..................... 330/252; 330/254
(58) Field of Classification Search ............ 330/253, 330/252, 254, 257, 263, 269, 260, 330
See application file for complete search history.

(56) References Cited

U.S. PATENT DOCUMENTS

| | | | | |
|---|---|---|---|---|
| 5,418,493 A | * | 5/1995 | Dijkmans | 330/253 |
| 5,510,745 A | * | 4/1996 | Hamano et al. | 327/333 |
| 5,734,297 A | * | 3/1998 | Huijsing et al. | 330/253 |
| 5,801,564 A | * | 9/1998 | Gasparik | 327/170 |
| 5,929,705 A | * | 7/1999 | Zhang et al. | 330/253 |
| 5,936,466 A | * | 8/1999 | Andoh et al. | 330/253 |
| 6,556,081 B1 | * | 4/2003 | Muza | 330/253 |
| 6,605,993 B1 | * | 8/2003 | Suzuki | 330/252 |
| 6,756,841 B1 | * | 6/2004 | Jaussi et al. | 327/562 |

OTHER PUBLICATIONS

"A 2.5 Gbps CMOS Optical Receiver Analog Front-End", by Wei-Zen Chen et al., IEEE 2002 Custon Integrated Circuits Conference, Jun. 2002, pp. 359-362.

* cited by examiner

*Primary Examiner*—Linh Nguyen

(57) ABSTRACT

Variable-gain amplifiers (VGAs) and/or continuous-time filters (CTFS) are implemented with circuitry that provides improved power-supply rejection. The power-supply rejection circuitry may include a current source and a diode-connected MOSFET that inhibit noise in the reference-voltage power supply from reaching the output nodes of the VGA or CTF. Although the present invention enables separate implementations of VGAs and CTFs, in one embodiment, a VGA function and a CTF function are implemented in a single set of (e.g., integrated) circuitry.

18 Claims, 4 Drawing Sheets

REJECTION CIRCUITRY FOR VARIABLE-GAIN AMPLIFIERS AND CONTINUOUS-TIME FILTERS

BACKGROUND OF THE INVENTION

1. Field of the Invention

The present invention relates to electrical signal processing, and, in particular, to circuitry that provides a variable-gain amplifier (VGA) function and/or a continuous-time filter (CTF) function.

2. Description of the Related Art

FIG. 1 shows a schematic circuit diagram of a prior-art MOSFET open-loop variable-gain amplifier (VGA) 100. VGA 100 has two equivalent, differential transistor pairs M6, M7 and M8, M9 connected, on the drain side, to two equivalent transconductance load devices M4 and M5 and, on the source side, to two current sinks 102 and 104. The differential input signal VIP, VIN is applied to the gates of the differential transistor pairs, while the differential output signal VOP, VON is presented at the drains of the differential transistor pairs. In particular, VIP is applied to the gates of M6 and M9, VIN is applied to the gates of M7 and M8, VOP is presented at a node shared by the drains of M7 and M9, and VON is presented at a node shared by the drains of M6 and M8.

Each transconductance load device is a MOSFET whose source is connected to the drain of one of the transistors in each differential pair and whose source and gate are both connected to reference voltage VDD. In particular, the source of M4 is connected to the drains of M6 and M8, while the source of M5 is connected to the drains of M7 and M9.

Each current sink is connected between the sources of both transistors in one of the differential pairs and reference voltage VSS (e.g., ground). In particular, current sink 102 is connected to a node shared by the sources of M6 and M7, while current sink 104 is connected to a node shared by the sources of M8 and M9. The current through current sink 104 is Ineg, while the current through current sink 102 is Itotal-Ineg.

To achieve log-linear gain adjustment using VGA 100, the current Ineg is adjusted in a linear fashion (keeping Itotal constant), providing near exponential gain control. A single pole $\omega_p$ at the output nodes is given by Equation (1) as follows:

$$\omega_p = \frac{g_{mload}}{C_l} \quad (1)$$

where $g_{mload}$ is the output transconductance due to the load devices, and $C_l$ is the sum of all parasitic capacitances at the output node VON.

As indicated by Equation (1), the bandwidth of VGA 100 is limited by the output transconductance and load capacitance. In addition, common-mode and power-supply rejection are limited by the direct connection of the gain terminals of transconductors M4 and M5 to the power supply or voltage reference VDD.

SUMMARY OF THE INVENTION

Problems in the prior art are addressed in accordance with the principles of the present invention by a variable-gain amplifier that provides improved bandwidth, common-mode rejection, and power-supply rejection as compared with prior-art VGAs such as VGA 100 of FIG. 1, while maintaining log-linear gain control. In one embodiment, a triode-biased MOSFET device is added in series with the gate connection of the load devices, which creates complex poles at the VGA output.

In one embodiment, the present invention is circuitry comprising a first differential transistor pair (e.g., M6, M7) connected between a first load device (e.g., M4) and a first current sink (e.g., 102). A first inductance-creating element (e.g., M2) is connected to the first load device to add inductance at a first output node (e.g., VON) of the circuitry, and a power-supply rejection element (e.g., M1 and I1) is connected between the first inductance-creating element and a first voltage reference (e.g., VDD) to provide power-supply rejection at the first output node.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments.

Figure 1:
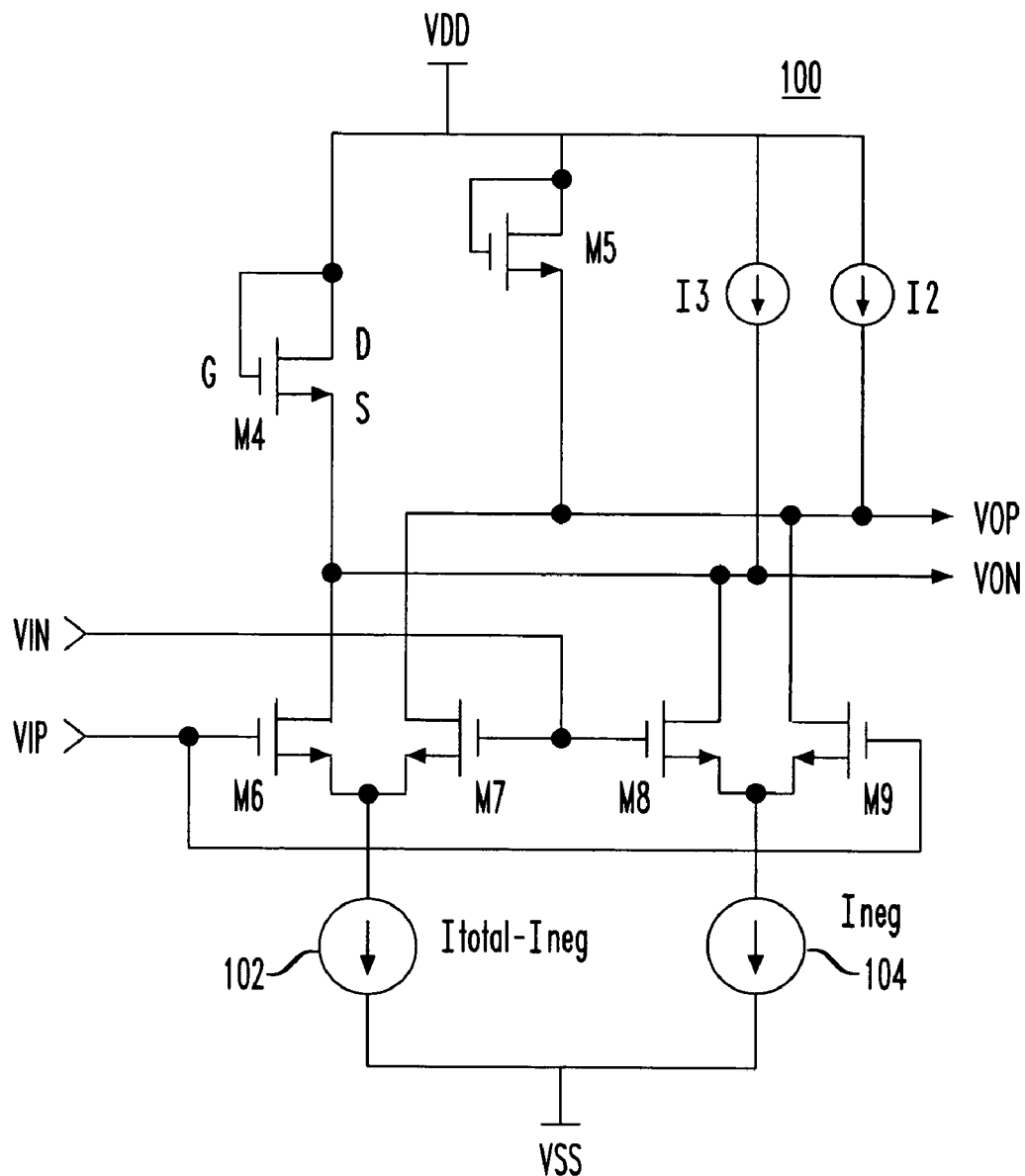
FIG. 1 shows a schematic circuit diagram of a prior-art MOSFET open-loop variable-gain amplifier.
Figure 2:
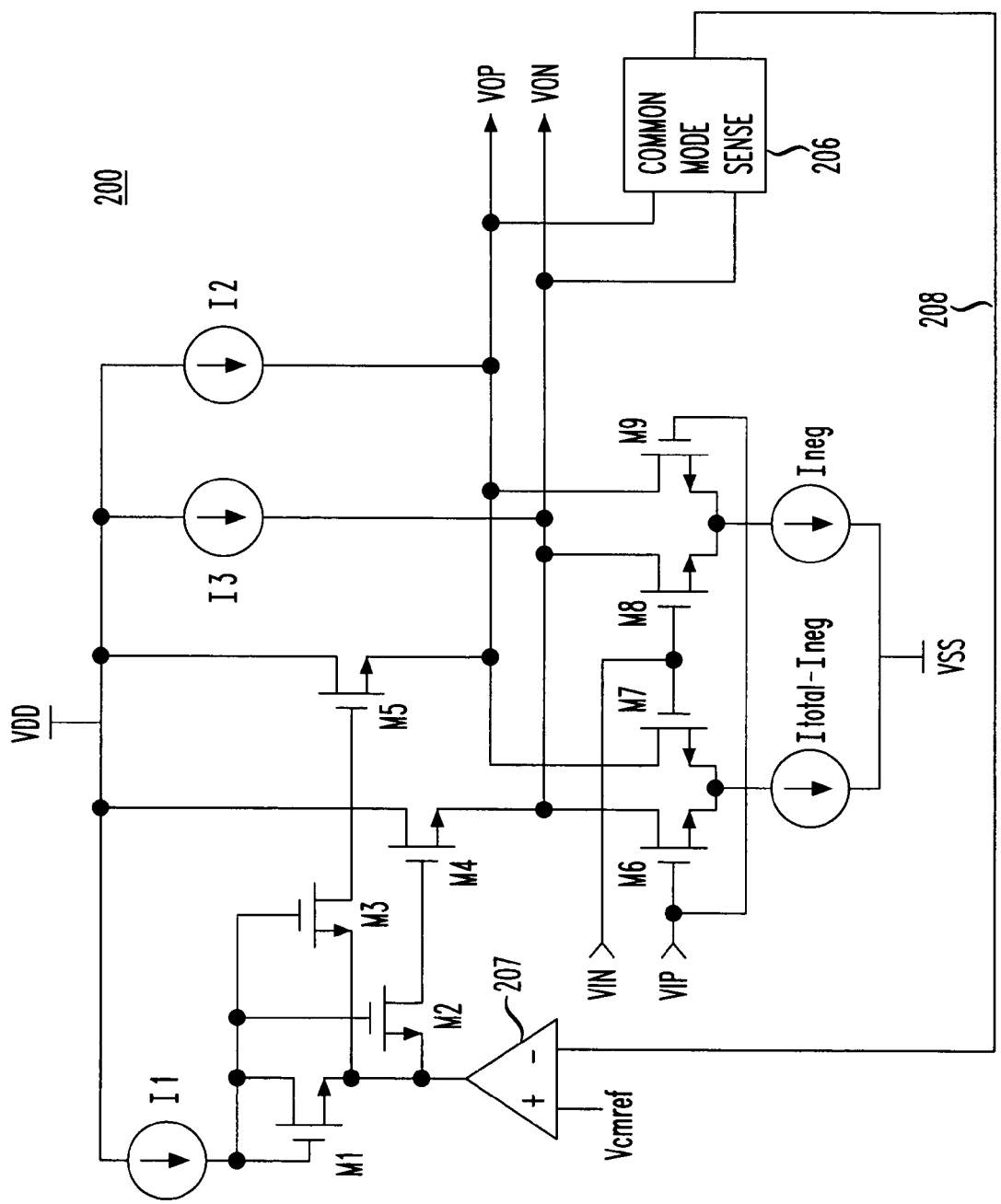
FIG. 2 shows a schematic circuit diagram of a MOSFET open-loop variable-gain amplifier.

FIG. 2 shows a schematic circuit diagram of a MOSFET open-loop variable-gain amplifier 200. VGA 200 has all of the same components as prior-art VGA 100 of FIG. 1. In addition, VGA 200 has three MOSFET devices M1-M3, current source I1, common-mode sense circuit 206, and differential amplifier 207.

As shown in FIG. 2, instead of being directly connected to VDD as in FIG. 1, the gates of load devices M4 and M5 are connected to the drains of devices M2 and M3. The sources of devices M2 and M3 are both connected to the source of device M1, while the gates of M1–M3 and the drain of M1 are all connected to current source I1, whose other side is connected to VDD. Current sources I2 and I3 are connected between VDD and output nodes VOP and VON, respectively. As configured, devices M4 and M5 operate as source followers, devices M2 and M3 add resistance to the gates of M4 and M5, and device M1 is drain-connected like a diode.

Devices M2 and M3 create an inductive component to the output impedance of the load devices, where the equivalent inductance L is approximated by Equation (2) as follows:

$$L \approx \frac{1}{g_{m4}z\left(1 - \frac{z}{p}\right)}, \quad (2)$$

where $g_{m4}$ is the output transconductance at output node VON due to device M4, z is given by Equation (3) as follows:

$$z = \frac{1}{R_{M2}(C_{gs} + C_{gd})}, \quad (3)$$

and p is given by Equation (4) as follows:

$$p = \frac{g_{m4}}{C_{gs} + C_l + g_{m4}R_{M2}C_{gd}}, \quad (4)$$

where $R_{M2}$ is the drain-to-source resistance of device M2 biased in triode mode (i.e., where the voltage from the drain to the source is proportional to the drain current, such that the device looks like a resistor), $C_{gs}$ is the gate-to-source capacitance of M4, $C_{gd}$ is the gate-to-drain capacitance of M4, and $C_l$ is the sum of the parasitic capacitances at output node VON. See W. Z. Chen and C. H. Lu, "A 2.5 Gbps CMOS Optical Receiver Analog Front-End," IEEE 2002 Custom Integrated Circuits Conferences, pp. 359–362, June 2002, the teachings of which are incorporated herein by reference.

Devices M2 and M3 are biased by gate-drain connected device M1, yielding a drain-to-source resistance from M2 and M3 that is proportional to the transconductance of M1. The effect of the added series resistance is to create a pair of complex poles at the output nodes VOP, VON. Without this series resistance, only a single sigma-axis pole would be present. By adjusting the drain-to-source resistance of M2 and M3, the Q of the complex poles can be adjusted to achieve critical damping, thereby improving the rise time and bandwidth of the circuit.

Because the gates of load devices M4 and M5 are not connected directly to the power supply VDD (as in the prior art of FIG. 1), power-supply rejection (i.e., the inhibition of noise in power supply VDD from reaching the output nodes VOP, VON) is greatly improved.

Common-mode sense circuit 206 is connected to the output nodes VOP and VON to determine and track the common-mode voltage (i.e., the average of VOP and VON). The sensed common-mode voltage 208 is applied as a feedback signal to differential amplifier 207, which also receives a desired common-mode voltage Vcmref. Differential amplifier 207 generates and injects a correction signal at the sources of devices M1, M2, and M3 to compensate for errors between the sensed and the desired common-mode voltages. As such, differential amplifier 207 functions as a common-mode error amplifier that can provide considerable improvement in common-mode rejection (i.e., ensuring that the common-mode output voltage remains constant with changes in the common-mode input voltage).

Replica biasing (i.e., generating a bias for the circuit based on a piece of the circuit in order to compensate for temperature and/or process variations) can be used to improve the voltage headroom of the circuit. This can be particularly important in low-voltage applications, where additional headroom is beneficial.

Figure 3:
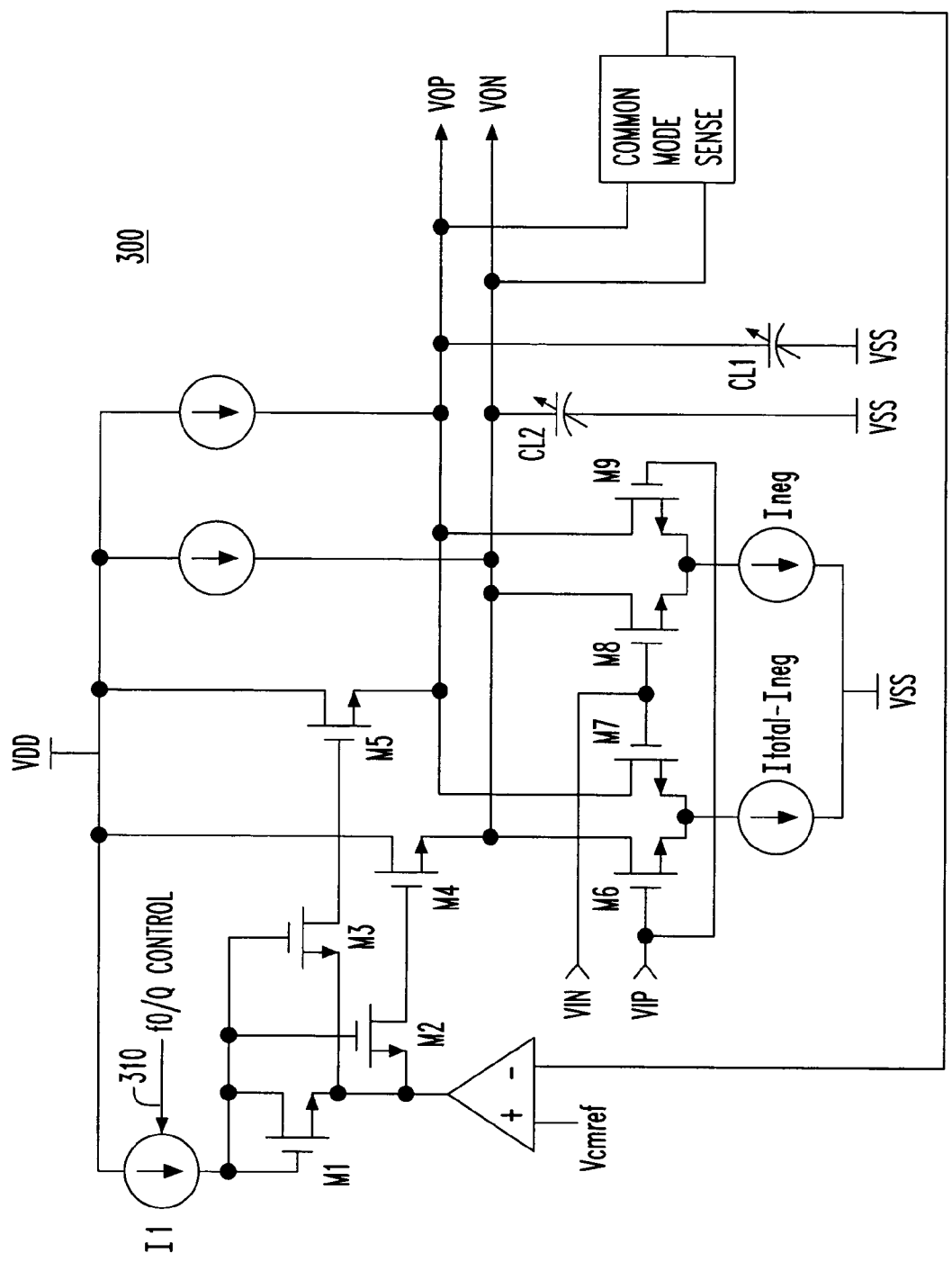
FIG. 3 shows a schematic circuit diagram of a circuit that implements a VGA, similar to the VGA of FIG. 2, and a continuous-time filter within a single set of circuitry.

FIG. 3 shows a schematic circuit diagram of a circuit 300, which implements a VGA, similar to VGA 200 of FIG. 2, and a continuous-time filter (CTF) within a single set of (e.g., integrated) circuitry. Combined VGA/CTF 300 has all of the same elements as VGA 200 of FIG. 2. In addition, circuit 300 has a pair of variable capacitors CL1–2 connected between reference voltage VSS (e.g., ground) and the output nodes VOP and VON, respectively. In addition, circuit 300 applies a control signal 310 to control the current generated by current source I1, e.g., adjusting the magnitude of the current to control the equivalent resistance from devices M2 and M3.

Capacitors CL1–2 and control signal 310 add a low-pass filter (LPF) function to the VGA function provided by the amplifier circuitry of FIG. 2. Prior-art implementations for analog front end (AFE) circuitry requiring both variable-gain and continuous-time filtering involve separate stages: one for the VGA followed by one for the CTF. In order to provide a predictable bandwidth for the overall AFE, the VGA in these prior-art implementations has bandwidth in excess of the CTF cutoff frequency. By implementing the VGA and the CTF in a single (e.g., integrated) amplifier stage, combined VGA/CTF 300 greatly decreases power dissipation as compared to the prior-art implementation, by eliminating the need for excess bandwidth in a separate VGA stage and possibly decreasing the total number of amplifier stages.

In operation, MOSFET devices M2 and M3 are biased in triode mode and have an output resistance that is inversely proportional to the transconductance of device M1. As described previously in the context of FIG. 2, the addition of a controllable resistance in series with the gates of load devices M4 and M5 creates a complex output impedance. When combined with load capacitors CL1–2 and with parasitic capacitances from the other devices connected to the outputs, a pair of complex poles are created.

Assuming that (1) the capacitance $C_L$ of capacitors CL1–2 is much greater than both the gate-to-drain capacitance $C_{gdM4}$ and the gate-to-source capacitance $C_{gsM4}$ of device M4 and (2) the sum of the output capacitances of all devices connected to the circuit outputs is relatively small, the output voltage $V_{out}$ can be represented according to Equation (5) as follows:

$$V_{out} = V_{in}\frac{g_{mvga}}{C_L} * \left[\frac{s + \frac{1}{R_{M2}(C_{gdM4} + C_{gsM4})}}{s^2 + \frac{s}{R_{M2}(C_{gdM4} + C_{gsM4})} + \frac{g_{M4}}{R_{M2}C_L(C_{gdM4} + C_{gsM4})}}\right], \quad (5)$$

where $V_{in}$ is the input voltage, $R_{M2}$ is the on-resistance of device M2 (or M3), $g_{M4}$ is the transconductance of device M4 (or M5), and $g_{mvga} = g_{mpos} - g_{mneg}$, where $g_{mpos}$ and $g_{mneg}$ are the transconductances of the differential pairs M6, M7 and M8, M9, respectively.

The high-frequency response has a high-frequency parasitic pole and a complex pole pair with characteristics given by Equations (6) and (7) as follows:

$$\omega_o = \sqrt{\frac{g_{M4}}{R_{M2}C_L(C_{gdM4} + C_{gsM4})}} \quad (6)$$

$$Q = \sqrt{\frac{g_{M4}R_{M2}(C_{gdM4} + C_{gsM4})}{C_L}} \quad (7)$$

where both the cut-off frequency $\omega_0$ and Q are adjustable through $R_{M2}$ and $C_L$. The low-frequency gain $A_{LF}$ is adjustable according to Equation (8) as follows:

$$A_{LF} = \frac{g_{mvga}}{g_{M4}} \quad (8)$$

As the current Ineg is increased, the tail current (Itotal-Ineg) for differential pair M6, M7 is decreased, yielding an approximately exponential gain dependency on Ineg. However, the total current Itotal for both differential pairs is constant with changes in Ineg. This keeps the transconductance $g_{M4}$ constant, allowing both $\omega_o$ and Q to remain constant with gain adjustment. Higher-order filter functions and increased gain range can be achieved by cascading multiple instances of similar combined VGA/CTF stages.

Control signal 310 modulates current source I1, which in turn varies the transconductance of M1. The triode resistance $R_{M2}$ of M2 and M3 is proportional to $1/g_{M1}$, where $g_{M1}$ is the transconductance of M1. Since (1) $R_{M2}$ is proportional to $1/g_{M1}$, (2) $g_{M1}$ is proportional to the square root of I1, and (3) the Q is proportional to the square root of $R_{M2}$, the Q can be controlled by appropriately adjusting control signal 310. By the same token, since the cutoff frequency is proportional to $1/\sqrt{R_{M2}}$, control signal 310 also adjusts the cutoff frequency.

Figure 4:
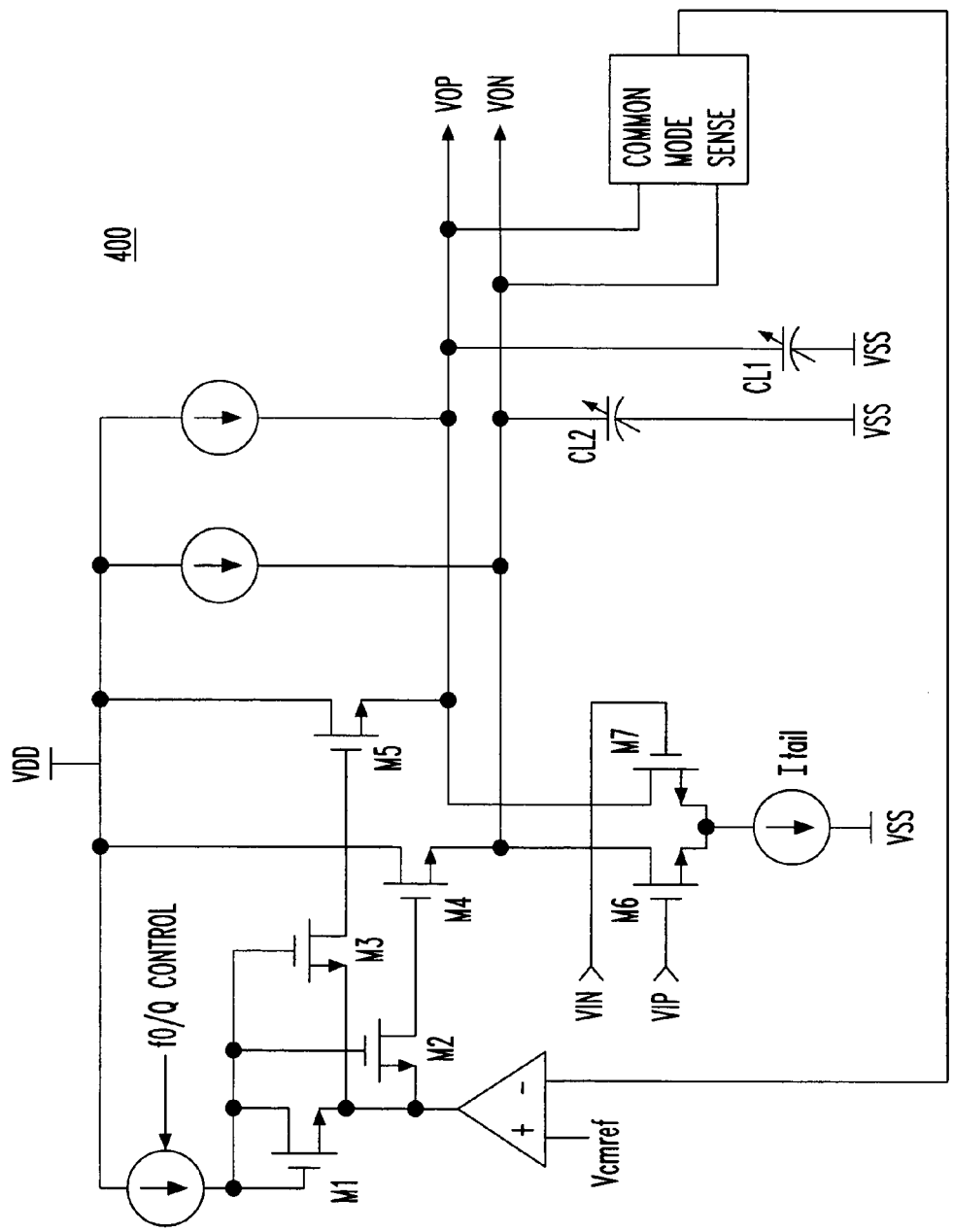
FIG. 4 shows a schematic circuit diagram of a continuous-time filter.

FIG. 4 shows a schematic block diagram of a continuous-time filter 400. CTF 400 is similar to combined VGA/CTF circuit 300 of FIG. 3 without the second differential pair M8, M9. As such, CTF 400 provides the filter function of circuit 300 without providing the VGA function of circuit 300. One significant advantage of this filter architecture is that a second-order filter section (i.e., a filter section having a pair of complex poles) can be created using a single amplifier.

Although the present invention has been shown as being implemented using particular MOSFET devices, those skilled in the art will understand that the present invention can be implemented using other types of devices. For example, p devices can be implemented using n devices, and vice versa. In addition, one or more or all of the devices could be implemented using a different IC technology such as bipolar technology.

The present invention may be implemented as circuit-based processes, including possible implementation as a single integrated circuit (such as an ASIC or an FPGA), a multi-chip module, a single card, or a multi-card circuit pack.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

We claim:

1. Circuitry comprising a first differential transistor pair connected between a first load device and a first current sink, wherein:
a first inductance-creating element is connected to the first load device to add inductance at a first output node of the circuitry; and
a power-supply rejection element is connected between the first inductance-creating element and a first voltage reference to provide power-supply rejection at the first output node.

2. The invention of claim 1, further comprising:
a second load device connected to the first differential transistor pair; and
a second inductance-creating element connected to the second load device to add inductance at a second output node of the circuitry, wherein the power-supply rejection element is connected between the second inductance-creating element and the first voltage reference to provide power-supply rejection at the second output node.

3. The invention of claim 2, further comprising a second differential transistor pair connected between the first and second load devices and a second current sink such that the circuitry is adapted to provide a variable-gain amplifier (VGA) function.

4. The invention of claim 3, wherein, when current through the first current sink increases, current through the second current sink is adapted to decrease such that total current through the first and second current sinks remains substantially constant to provide the VGA function with near exponential gain control.

5. The invention of claim 3, further comprising:
a common-mode sense circuit connected to the first and second output nodes and adapted to generate a sensed common-mode voltage signal; and
a differential amplifier connected to receive the sensed common-mode voltage signal and a desired common mode voltage signal and adapted to generate and apply a common-mode error-correction signal to the first and second inductance-creating elements to correct for differences between the sensed and the desired common-mode voltage signals.

6. The invention of claim 5, further comprising:
a first capacitor connected between the first output node and a second reference voltage; and
a second capacitor connected between the second output node and the second reference voltage such that the circuitry is adapted to provide a continuous-time filter (CTF) function in addition to the VGA function.

7. The invention of claim 6, wherein the first and second capacitors are variable capacitors.

8. The invention of claim 6, wherein the power-supply rejection element comprises a current source whose current is controlled by a control signal that is adapted to be adjusted to adjust equivalent resistance provided by the first and second inductance-creating elements.

9. The invention of claim 2, further comprising:
a common-mode sense circuit connected to the first and second output nodes and adapted to generate a sensed common-mode voltage signal; and
a differential amplifier connected to receive the sensed common-mode voltage signal and a desired common mode voltage signal and adapted to generate and apply a common-mode error-correction signal to the first and second inductance-creating elements to correct for differences between the sensed and the desired common-mode voltage signals.

10. The invention of claim 9, further comprising:
a first capacitor connected between the first output node and a second reference voltage; and
a second capacitor connected between the second output node and the second reference voltage such that the circuitry is adapted to provide a continuous-time filter (CTF) function.

11. The invention of claim 10, wherein the first and second capacitors are variable capacitors.

12. The invention of claim 10, wherein the power-supply rejection element comprises a current source whose current is controlled by a control signal that is adapted to be adjusted to adjust equivalent resistance provided by the first and second inductance-creating elements.

13. The invention of claim 1, further comprising:
a second load device connected to the first differential transistor pair;
a second inductance-creating element connected to the second load device to add inductance at a second output node of the circuitry, wherein the power-supply rejection element is connected between the second inductance-creating element and the first voltage reference to provide power-supply rejection at the second output node;
a second differential transistor pair connected between the first and second load devices and a second current sink such that the circuitry is adapted to provide a variable-gain amplifier (VGA) function;
a common-mode sense circuit connected to the first and second output nodes and adapted to generate a sensed common-mode voltage signal; and
a differential amplifier connected to receive the sensed common-mode voltage signal and a desired common mode voltage signal and adapted to generate and apply a common-mode error-correction signal to the first and second inductance-creating elements to correct for differences between the sensed and the desired common-mode voltage signals, wherein:
the first differential transistor pair comprises transistor M6 and transistor M7;
the second differential transistor pair comprises transistor M8 and transistor M9;
the first load device comprises transistor M4;
the second load device comprises transistor M5;
the first inductance-creating element comprises transistor M2;
the second inductance-creating element comprises transistor M3;
the power-supply rejection element comprises transistor M1 and current source I1;
a first input node is connected to the gates of transistors M6 and M9;
a second input node is connected to the gates of transistors M7 and M8;
the sources of transistors M6 and M7 are connected to the first current sink;
the sources of transistors M8 and M9 are connected to the second current sink;
the drains of transistors M6 and M8 are connected to the first output node and to the source of transistor M4;
the drains of transistors M7 and M9 are connected to the second output node and to the source of transistor M5;
the drains of transistors M4 and M5 are connected to the first reference voltage;
the gate of transistor M4 is connected to the drain of transistor M2;
the gate of transistor M5 is connected to the drain of transistor M3;
the sources of transistors M1, M2, and M3 are connected together and to receive the common-mode error-correction signal; and
the gates of transistors M1, M2, and M3 and the drain of transistor M1 are connected together and to receive the current from current source I1.

14. The invention of claim 13, wherein, when current through the first current sink increases, current through the second current sink is adapted to decrease such that total current through the first and second current sinks remains substantially constant to provide the VGA function with near exponential gain control.

15. The invention of claim 13, further comprising:
a first variable capacitor connected between the first output node and a second reference voltage; and
a second variable capacitor connected between the second output node and the second reference voltage such that the circuitry is adapted to provide a continuous-time filter (CTF) function in addition to the VGA function.

16. The invention of claim 15, wherein the current of current source I1 is controlled by a control signal that is adapted to be adjusted to adjust equivalent resistance provided by transistors M2 and M3.

17. The invention of claim 1, further comprising:
a second load device connected to the first differential transistor pair;
a second inductance-creating element connected to the second load device to add inductance at a second output node of the circuitry, wherein the power-supply rejection element is connected between the second inductance-creating element and the first voltage reference to provide power-supply rejection at the second output node;
a common-mode sense circuit connected to the first and second output nodes and adapted to generate a sensed common-mode voltage signal;
a differential amplifier connected to receive the sensed common-mode voltage signal and a desired common mode voltage signal and adapted to generate and apply a common-mode error-correction signal to the first and second inductance-creating elements to correct for differences between the sensed and the desired common-mode voltage signals;
a first variable capacitor connected between the first output node and a second reference voltage; and
a second variable capacitor connected between the second output node and the second reference voltage such that the circuitry is adapted to provide a continuous-time filter (CTF) function, wherein:
the first differential transistor pair comprises transistor M6 and transistor M7;
the first load device comprises transistor M4;
the second load device comprises transistor M5;
the first inductance-creating element comprises transistor M2;

the second inductance-creating element comprises transistor M3;
the power-supply rejection element comprises transistor M1 and current source I1;
a first input node VIP is connected to the gates of transistors M6 and M9;
a second input node VIN is connected to the gates of transistors M7 and M8;
the sources of transistors M6 and M7 are connected to the first current sink;
the drain of transistor M6 is connected to the first output node and to the source of transistor M4;
the drain of transistor M7 is connected to the second output node and to the source of transistor M5;
the drains of transistors M4 and M5 are connected to the first reference voltage;
the gate of transistor M4 is connected to the drain of transistor M2;
the gate of transistor M5 is connected to the drain of transistor M3;
the sources of transistors M1, M2, and M3 are connected together and to receive the common-mode error-correction signal; and
the gates of transistors M1, M2, and M3 and the drain of transistor M1 are connected together and to receive the current from current source I1.

18. The invention of claim 17, wherein the current of current source I1 is controlled by a control signal that is adapted to be adjusted to adjust equivalent resistance provided by transistors M2 and M3.

* * * * *